(12) United States Patent
Hu et al.

(10) Patent No.: US 8,952,268 B2
(45) Date of Patent: Feb. 10, 2015

(54) INTERPOSED SUBSTRATE AND MANUFACTURING METHOD THEREOF

(75) Inventors: Dyi-Chung Hu, Hsinchu County (TW); Ming-Chih Chen, Hsinchu (TW); Tzyy-Jang Tseng, Hsinchu (TW)

(73) Assignee: Unimicron Technology Corp., Taoyuan (TW)

( * ) Notice: Subject to any disclaimer, the term of this patent is extended or adjusted under 35 U.S.C. 154(b) by 143 days.

(21) Appl. No.: 13/543,893

(22) Filed: Jul. 9, 2012

(65) Prior Publication Data

US 2013/0313011 A1    Nov. 28, 2013

(30) Foreign Application Priority Data

May 24, 2012   (TW) .............................. 101118578 A

(51) Int. Cl.
*H05K 1/11*    (2006.01)

(52) U.S. Cl.
USPC ......................................... 174/265; 174/262

(58) Field of Classification Search
CPC .......... B23K 31/02; C25D 1/003; C25D 5/02; H05K 1/11; H05K 3/00; H05K 3/10
USPC ................. 174/255, 256, 258, 260, 262–267; 257/690, 686
See application file for complete search history.

(56) References Cited

U.S. PATENT DOCUMENTS

| 8,383,457 | B2* | 2/2013 | Pagaila et al. ................. 438/109 |
| 8,445,790 | B2* | 5/2013 | Lee et al. ...................... 174/264 |
| 2004/0108587 | A1* | 6/2004 | Chudzik et al. ............... 257/700 |
| 2008/0128885 | A1* | 6/2008 | Lee et al. ...................... 257/690 |
| 2011/0186977 | A1* | 8/2011 | Chi et al. ...................... 257/686 |
| 2014/0103527 | A1* | 4/2014 | Marimuthu et al. .......... 257/737 |

FOREIGN PATENT DOCUMENTS

TW     I352414     11/2011

* cited by examiner

*Primary Examiner* — Yuriy Semenenko
(74) *Attorney, Agent, or Firm* — Jianq Chyun IP Office

(57) ABSTRACT

A manufacturing method of an interposed substrate is provided. A photoresist layer is formed on a metal carrier. The photoresist layer has plural of openings exposing a portion of the metal carrier. Plural of metal passivation pads and plural of conductive pillars are formed in the openings. The metal passivation pads cover a portion of the metal carrier exposed by openings. The conductive pillars are respectively stacked on the metal passivation pads. The photoresist layer is removed to expose another portion of the metal carrier. An insulating material layer is formed on the metal carrier. The insulating material layer covers the another portion of the metal carrier and encapsulates the conductive pillars and the metal passivation pads. An upper surface of the insulating material layer and a top surface of each conductive pillar are coplanar. The metal carrier is removed to expose a lower surface of the insulating material layer.

3 Claims, 11 Drawing Sheets

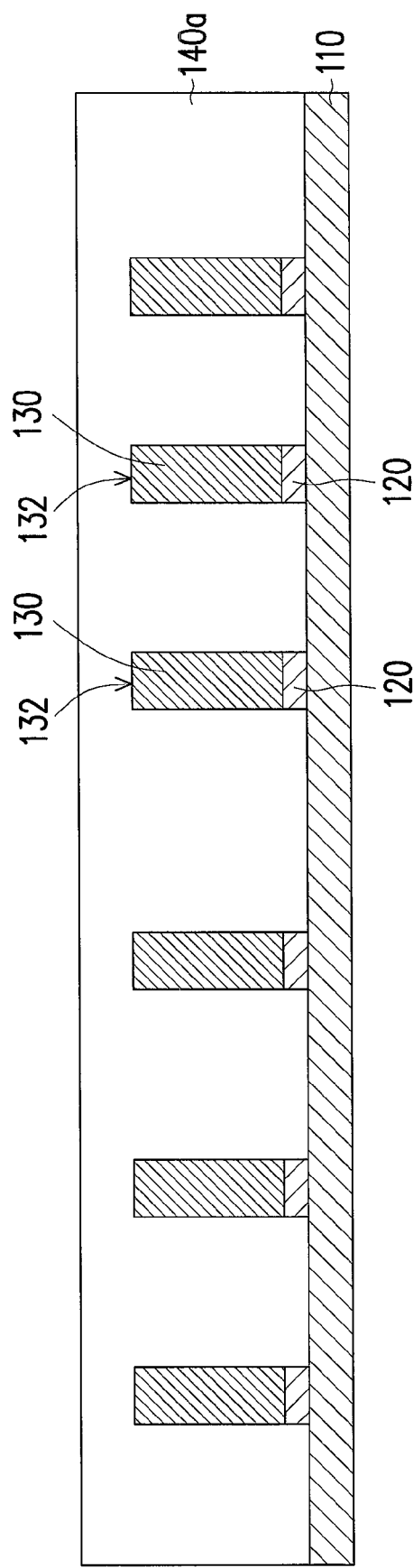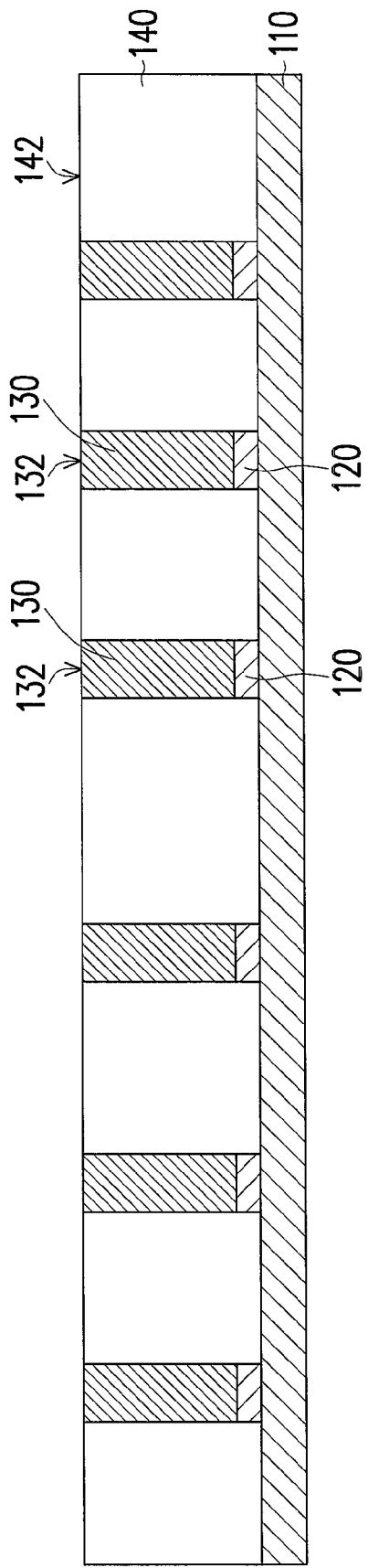
FIG. 1C
FIG. 1D

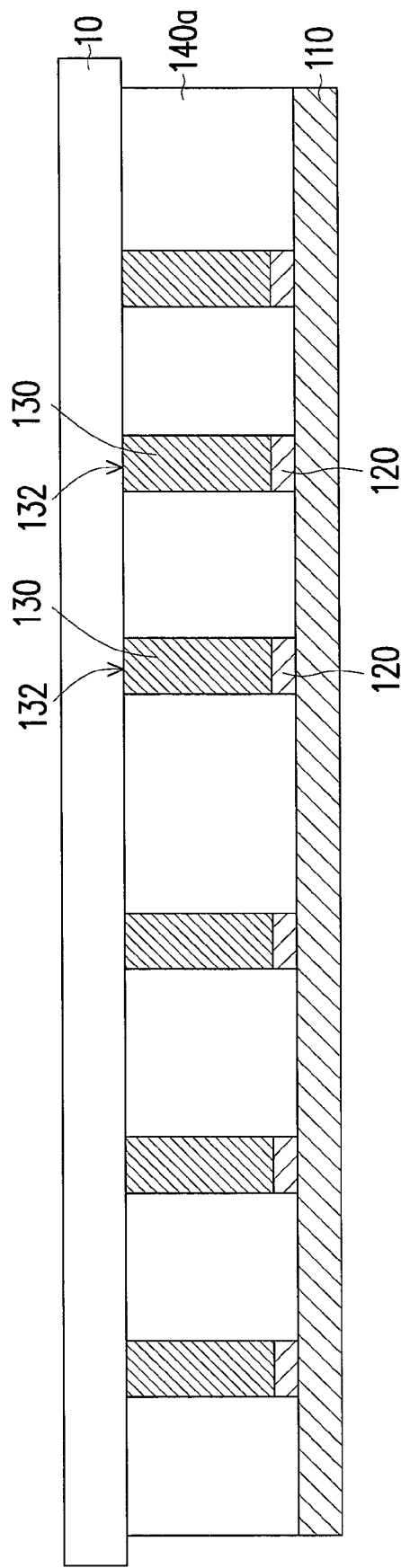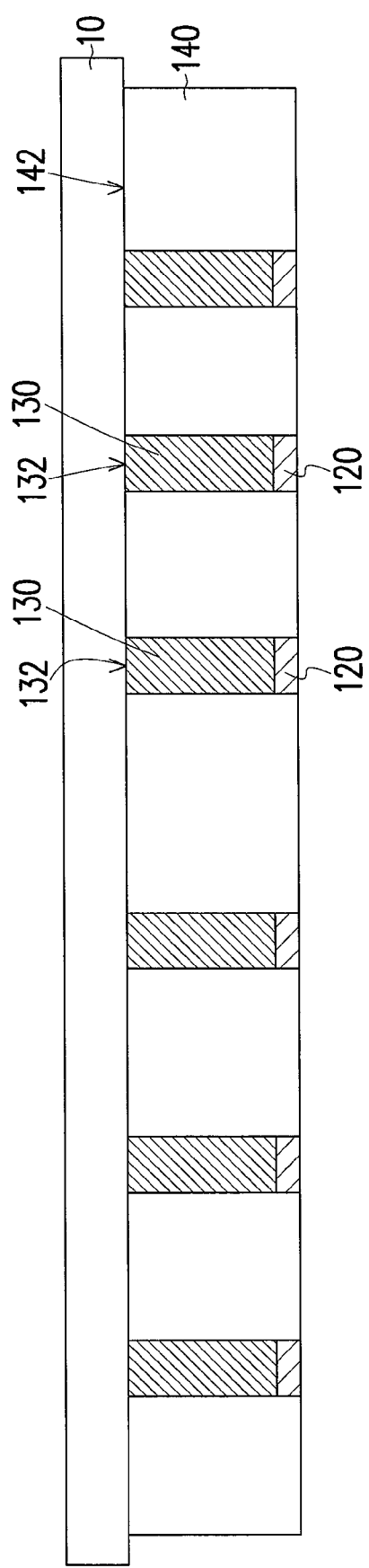
FIG. 1E
FIG. 1F

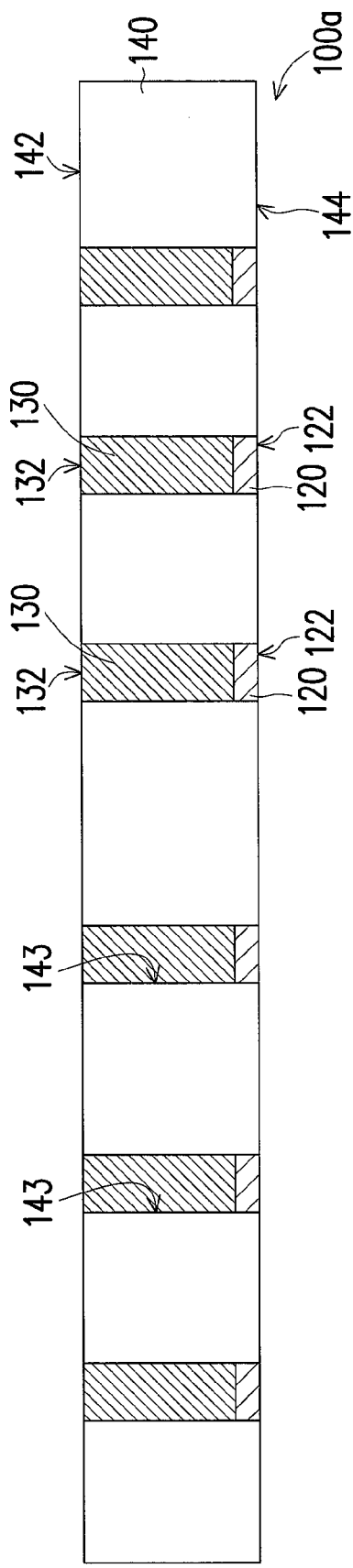
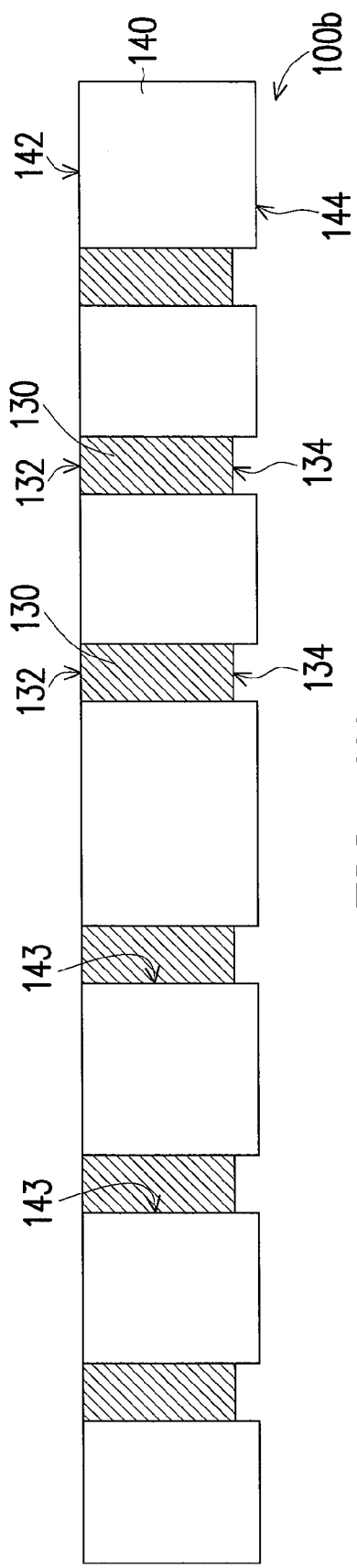
FIG. 1G
FIG. 1H

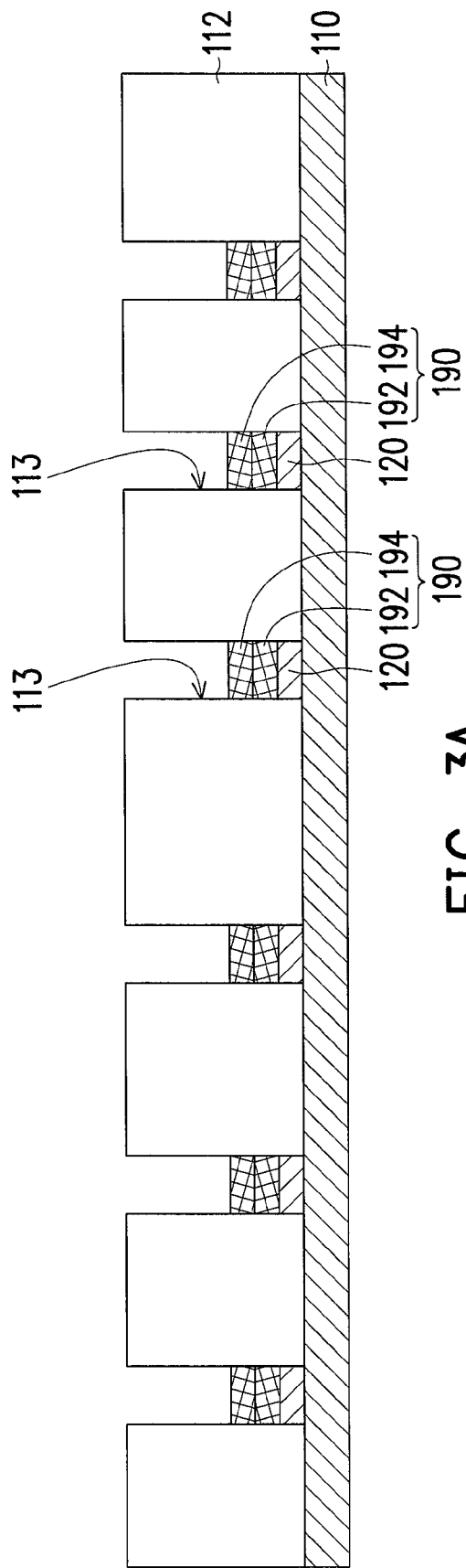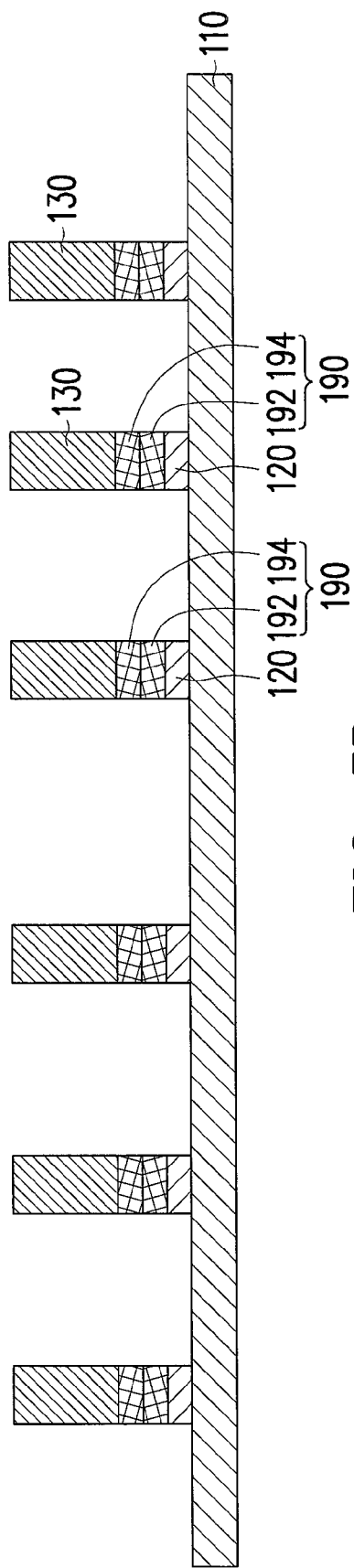
FIG. 3A
FIG. 3B

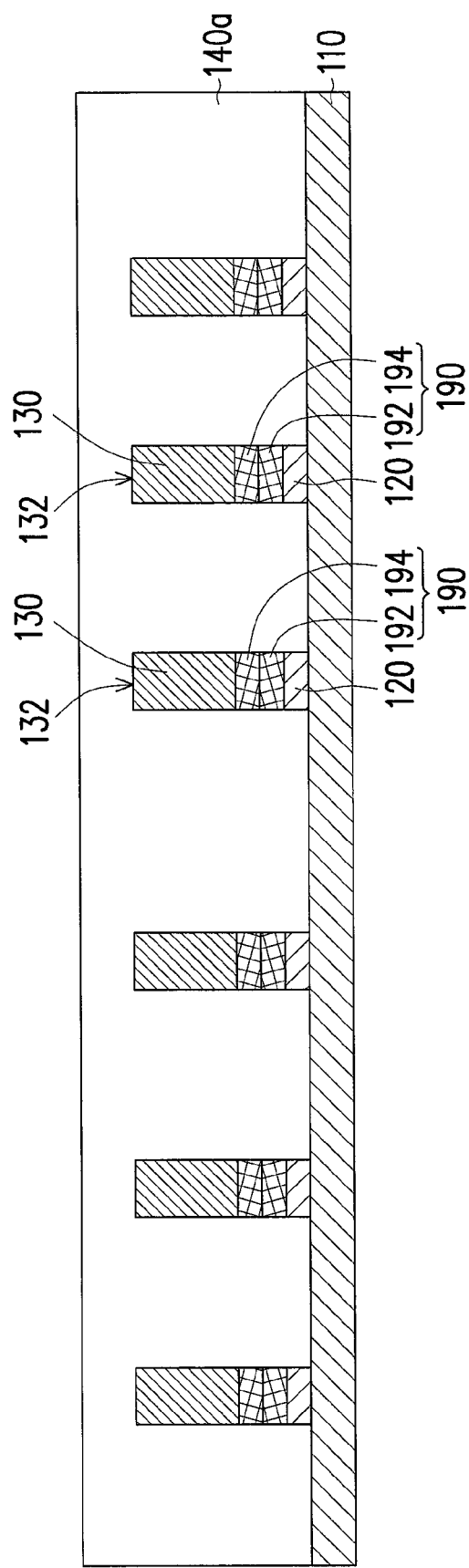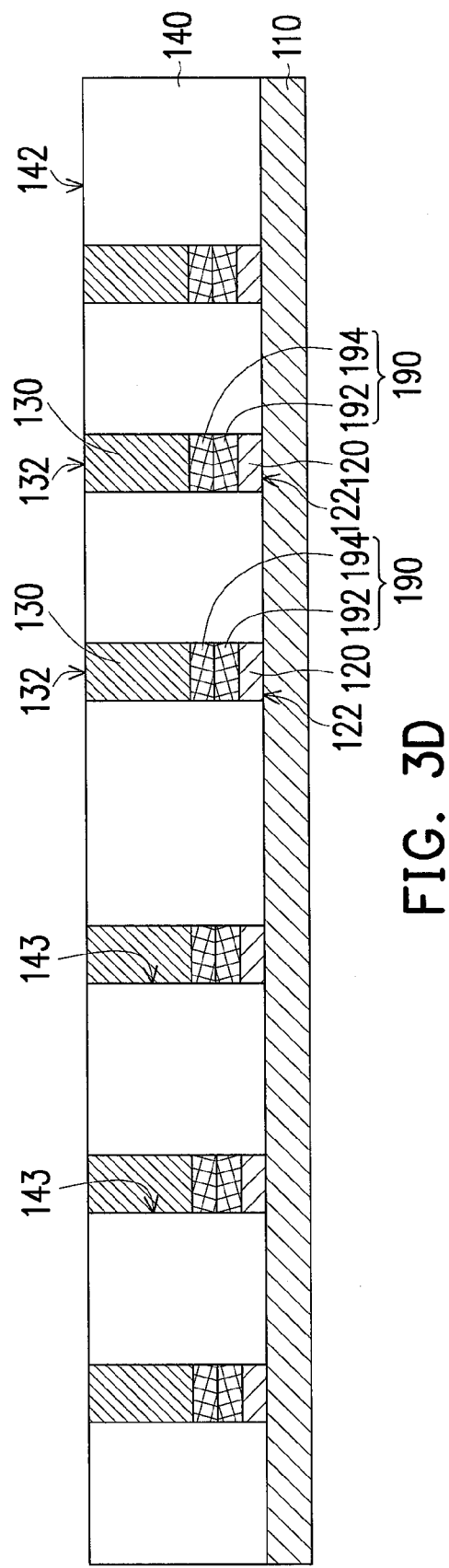
FIG. 3C
FIG. 3D

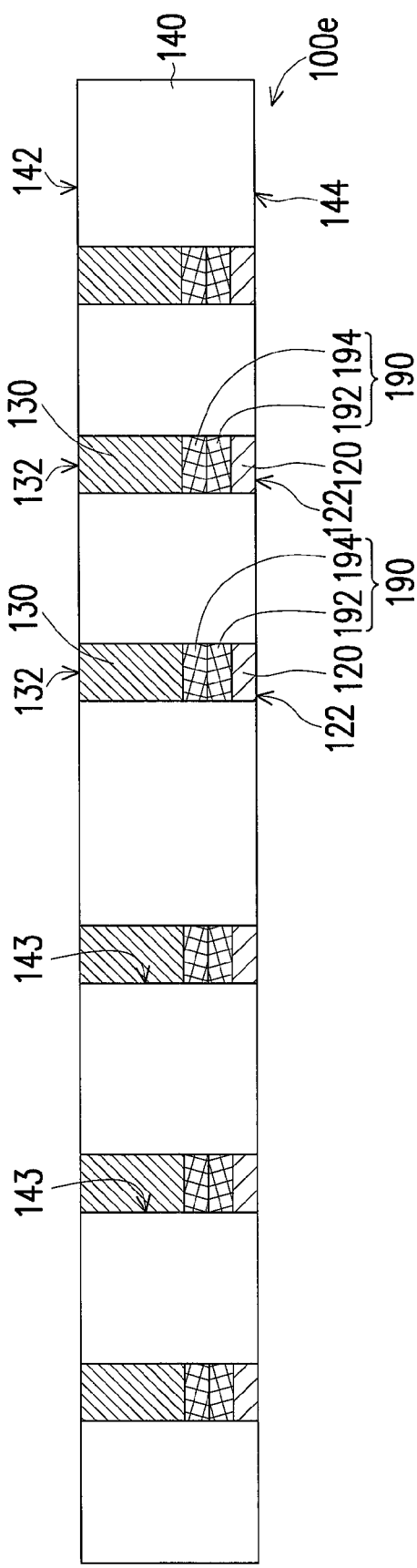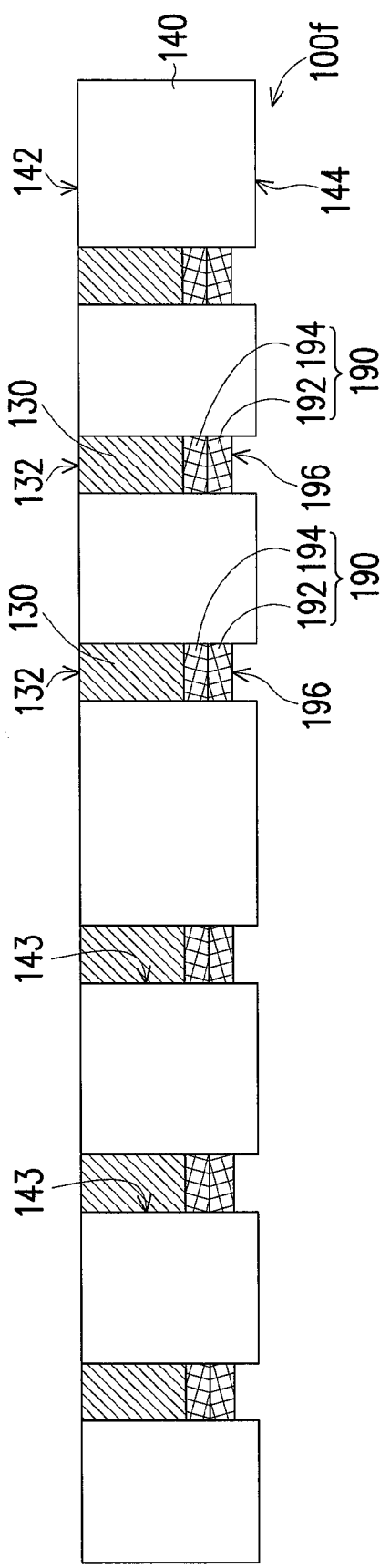

INTERPOSED SUBSTRATE AND MANUFACTURING METHOD THEREOF

CROSS-REFERENCE TO RELATED APPLICATION

This application claims the priority benefit of Taiwan application serial no. 101118578, filed on May 24, 2012. The entirety of the above-mentioned patent application is hereby incorporated by reference herein and made a part of this specification.

BACKGROUND

1. Field of the Invention

The invention relates to a substrate and a manufacturing method thereof, and more particularly to, an interposed substrate and a manufacturing method thereof.

2. Description of Related Art

In the current information society, the design of electronic product is tended towards a trend of lightweight, thin, short, and compactness. As such, the development of various packaging technologies, such as the stack-type semiconductor device packaging technology, facilitates a miniaturization of the semiconductor package. In a stacked-type semiconductor device package, a plurality of semiconductor devices is vertically stacked and packaged in the same package structure, so as to improve package density and facilitate package miniaturization.

In conventional stacked-type semiconductor device package, through silicon vias (TSV) are often formed within an interposed substrate, wherein a function of the through silicon vias is to manufacture a vertical conductive role between chip to chip or wafer to wafer. As for producing the through silicon vias, firstly, vias are formed on a silicon wafer, and then a filling process is performed through electroplating to form the through silicon vias. Afterward, a redistribution circuit layer and a plurality of bumps are also formed on the interposed substrate, so that the interposed substrate may be smoothly bonded to a carrier substrate.

Nevertheless, a material of the interposed substrate is a silicon wafer, and thus a required cost is higher. In addition, the through silicon vias are often formed along with components on a semiconductor wafer; therefore, in order to avoid a conductive material from entering an active area in the circuit of a silicon wafer, mostly, a passivation layer is firstly formed on the silicon wafer and on the interior wall of the vias, and after the manufacture of the through silicon vias is completed, the passivation layer is then removed to isolate the through silicon vias from the other components. However, the aforementioned production process is much complicated.

SUMMARY OF THE INVENTION

The invention provides an interposed substrate capable of effectively reducing a manufacture cost while having a favorable structure and electrical reliability.

The invention provides a manufacturing method of an interposed substrate to manufacture the aforementioned interposed substrate.

The invention provides a manufacturing method of an interposed substrate including the following steps. A metal carrier is provided. A photoresist layer is formed on the metal carrier. The photoresist layer has a plurality of openings, and a portion of the metal carrier is exposed by the openings. A plurality of metal passivation pads is formed with in the openings of the photoresist layer. The metal passivation pads cover a portion of the metal carrier exposed by the openings. A plurality of conductive pillars is formed in the openings of the photoresist layer. The conductive pillars are respectively stacked on the metal passivation pads. The photoresist layer is removed to expose another portion of the metal carrier. An insulating material layer is formed on the metal carrier. The insulating material layer covers the another portion of the metal carrier and encapsulates the conductive pillars and the metal passivation pads. The metal carrier is removed to expose a lower surface opposite to an upper surface of the insulating material layer.

The invention further provides an interposed substrate including an insulating material layer and a plurality of conductive pillars. The insulating material layer has an upper surface and a lower surface opposite to each other and a plurality of through holes penetrating through the insulating material layer. The conductive pillars are respectively disposed within the thorough holes of the insulating material layer. Each conductive pillar has a top surface and a bottom surface opposite to each other. The top surface of each conductive pillar and the upper surface of the insulating material layer are coplanar.

According to the foregoing, the manufacture of the interposed substrate of the invention forms the conductive pillars through utilizing the metal carrier, subsequently forms the insulating material layer on the metal carrier to cover the conductive pillars, and then removes the metal carrier to expose the lower surface of the insulating material layer. Consequently, in comparison to the conventional technique of manufacturing the interposed substrate using a silicon wafer, the interposed substrate of the invention requires neither the silicon wafer nor an additional fabrication of an insulating layer, and is therefore capable of effectively reducing a manufacture cost and having relatively simple manufacture steps. Furthermore, since the conductive pillars are covered by the insulating material layer, such that no electrical leakage problem would occur even through without the additional fabrication of the insulating layer, the interposed substrate of the invention may have favorable electrical reliability. In addition, the conductive pillars are covered by the insulating material layer, and thus when the metal carrier is removed, the conductive pillars are not to be eroded by an etchant, so that the interposed substrate of the invention may have a favorable structure reliability.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 1A to FIG. 1G are schematic cross-sectional views illustrating a manufacturing method of an interposed substrate according to an embodiment.

FIG. 1H is a schematic cross-sectional view illustrating an interposed substrate according to an embodiment.

FIG. 3A to FIG. 3E are schematic cross-sectional views illustrating a manufacturing method of an interposed substrate according to an embodiment.

FIG. 3F is a schematic cross-sectional view illustrating an interposed substrate according to another embodiment.

DETAILED DESCRIPTION OF DISCLOSED EMBODIMENTS

FIG. 1A to FIG. 1G are schematic cross-sectional views illustrating a manufacturing method of an interposed substrate according to an embodiment. According to the manufacturing method of the interposed substrate in the present embodiment, firstly, referring to FIG. 1A, a metal carrier 110 is provided, wherein a material of the metal carrier 110 is, for example, copper foil. Next, a photoresist layer 112 is formed on the metal carrier 110, wherein the photoresist layer 112 has a plurality of openings 113, and a portion of the metal carrier 110 is exposed by the openings 113. Then, a plurality of metal passivation pads 120 is formed in the openings 113 of the photoresist layer 112, wherein the metal passivation pads 120 cover the portion of the metal carrier 110 exposed by the openings 113. Herein, a step of forming the metal passivation pads 120 is to electroplate the metal passivation pads 120 at the portion of the metal carrier 110 exposed by the openings 113 through utilizing the photoresist layer 112 as an electroplating mask, wherein a material of the metal passivation pads 120 is, for example, copper, nickel or gold.

Figure 1A:
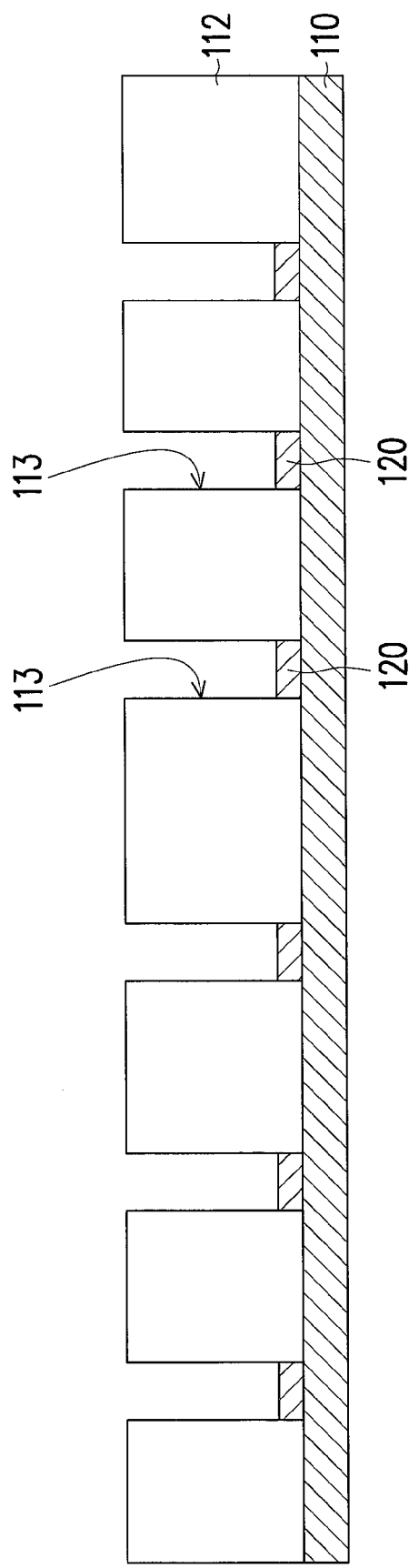
Figure 1B:
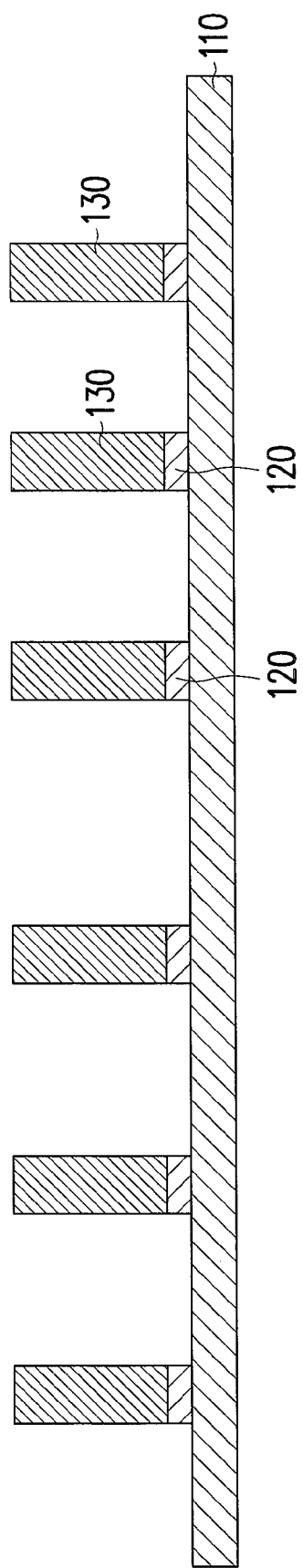

Next, referring to FIG. 1A and FIG. 1B, a plurality of conductive pillars 130 is formed in the openings 113 of the photoresist layer 112, wherein the conductive pillars 130 are respectively stacked on the metal passivation pads 120. Next, the photoresist layer 112 is removed to expose another portion of the metal carrier 110. Herein, a step of forming the conductive pillars 130 is to electroplate the conductive pillars 130 in the openings 113 through utilizing the photoresist layer 112 as an electroplating mask, wherein a material of the conductive pillars 130 is, for example, copper, nickel or gold.

Next, referring to FIG. 1C, an insulating material layer 140a is formed on the metal carrier 110 through a printing process or a thermal pressing process, wherein the insulating material layer 140a covers another portion of the metal carrier 110 and encapsulates the conductive pillars 130 and the metal passivation pads 120. Herein, a top surface 132 of each conductive pillar 130 is completely covered by the insulating material layer 140a, and a material of the insulating material layer 140a is, for example, ajinomoto build-up film (ABF) resin, benzocyclobutene (BCB) resin, photoresist material (e.g., a material researched and developed by Shin-Etsu Chemical Co., Ltd; in brief: SINR), polybenzoxazole (PBO), methyl silicone resin, nethyl silicone resin, phenyl silicone resin, epoxy silicone resin, or polymer resin.

Next, referring to FIG. 1D, a part of the insulating material layer 140a is removed through a grinding process or a laser-lift off process, so as to form an insulating material layer 140 which exposes the tops surfaces 132 of the conductive pillars 130. Herein, an upper surface 142 of the insulating material layer 140 and the top surfaces 132 of the conductive pillars 130 are substantially coplanar.

Next, referring to FIG. 1E, an adhesive tape 10 is formed on the insulating material layer 140, wherein the adhesive tape 10 covers the upper surface 142 of the insulating material layer 140 and the top surfaces 132 of the conductive pillars 130.

After, referring to FIG. 1F, the metal carrier 110 is removed to expose a lower surface 144 opposite to the upper surface 142 of the insulating material layer 140, wherein, wherein a method of removing of the metal carrier 110 is, for example, a back etching process. Herein, a bottom surface 122 of each metal passivation pad 120 and the lower surface 144 of the insulating material layer 140 are substantially coplanar.

Referring to FIG. 1E and FIG. 1G, the adhesive tape 10 is removed to expose the upper surface 142 of the insulating material layer 140 and the top surface 132 of the conductive pillars 130. At this point, the manufacture of the interposed substrate 100a is completed.

Noteworthily, in order to have a favorable joining between a plurality of subsequent solder balls (not shown), the metal passivation pads 120 may also be removed after removing the metal carrier 110, referring to FIG. 1H, so as to expose a bottom surface 134 of the each conductive pillar 130 to complete the manufacture of the interposed substrate 100b. It is noted that a step of removing the metal passivation pads 120 is a selective step, and users according to a material of the chosen solder ball and the material of the metal passivation pads 120 may select whether to perform the step of removing the metal passivation layer 120, and it is limited herein.

Structurally, referring to FIG. 1H again, the interposed substrate 100b of the present embodiment includes the insulating material layer 140 and the conductive pillars 130. The insulating material layer 140 has the upper surface 142 and the lower surface 144 opposite to each other and a plurality of through holes 143 penetrating through the insulating material layer 140. The conductive pillars 130 are respectively disposed within the through holes 143 of the insulating material layer 140, and the conductive pillars 130 have the top surfaces 132 and the bottom surfaces 134 opposite to each other. The top surfaces 132 of the conductive pillars 130 and the upper surface 142 of the insulating material layer 140 are substantially coplanar. Certainly, in another embodiment, referring to FIG. 1G, the interposed substrate 100a may further include the metal passivation pads 120, wherein the metal passivation pads 120 are respectively disposed within the through holes 143 of the insulating material layer 140. The conductive pillars 130 are respectively stacked on the metal passivation pads 120, and the bottom surfaces 122 of the metal passivation pads 120 and the lower surface 144 of the insulating material layer 140 are substantially coplanar.

Since the manufacture of the interposed substrate 100a (or 100b) of the present embodiment manufactures the conductive pillars 130 through utilizing the metal carrier 110, subsequently forms the insulating material layer 140 on the metal carrier 110 to cover the conductive pillars 130, and then removes the metal carrier 110 to expose the lower surface 142 of the insulating material layer 140, in comparison to the conventional technique of manufacturing the interposed substrate using a silicon wafer, the interposed substrate 110a (or 100b) of the present embodiment requires neither the silicon wafer nor an additional fabrication of an insulating layer, and is therefore capable of effectively reducing a manufacture cost and having relatively simple manufacture steps. Furthermore, since the conductive pillars 130 are covered by the insulating material layer 140, such that no electrical leakage problem would occur even through without the additional fabrication of the insulating layer, the interposed substrate 100a (or 100b) of the present embodiment may have favorable electrical reliability. In addition, the conductive pillars 130 are covered by the insulating material layer 140, and thus when the metal carrier 110 is removed, the conductive pillars 130 are not to be eroded by an etchant, so that the interposed substrate 100a (or 100b) of the present embodiment may have a favorable structure reliability.

The following embodiment has adopted component notations and part of the contents from the previous embodiments, wherein the same notations are used for representing the same or similar components, and descriptions of the same technical contents are omitted. The descriptions regarding to the omitted part may be referred to the previous embodiments, and thus is not repeated herein.

Figure 2A:
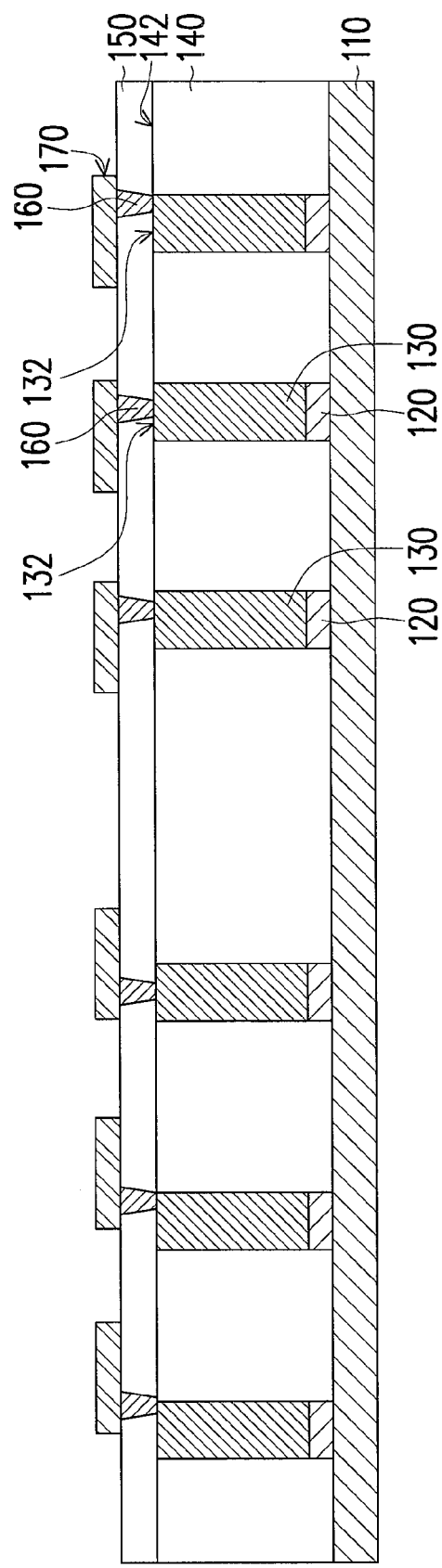
FIG. 2A to FIG. 2D are schematic cross-sectional views illustrating partial steps of a manufacturing method of an interposed substrate according to an embodiment.
Figure 2B:
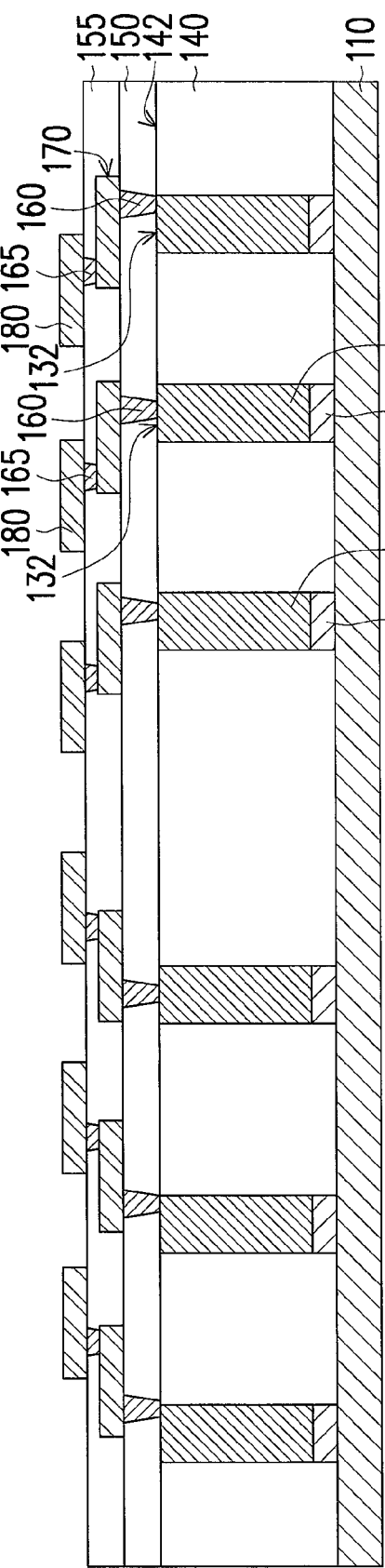
Figure 2C:
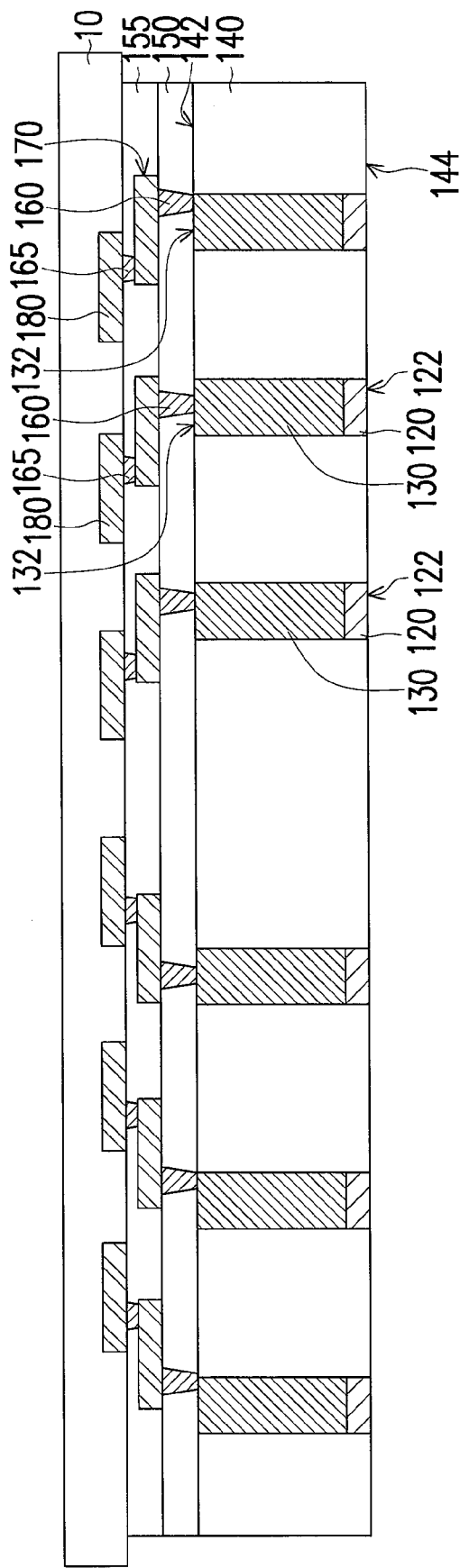
Figure 2D:
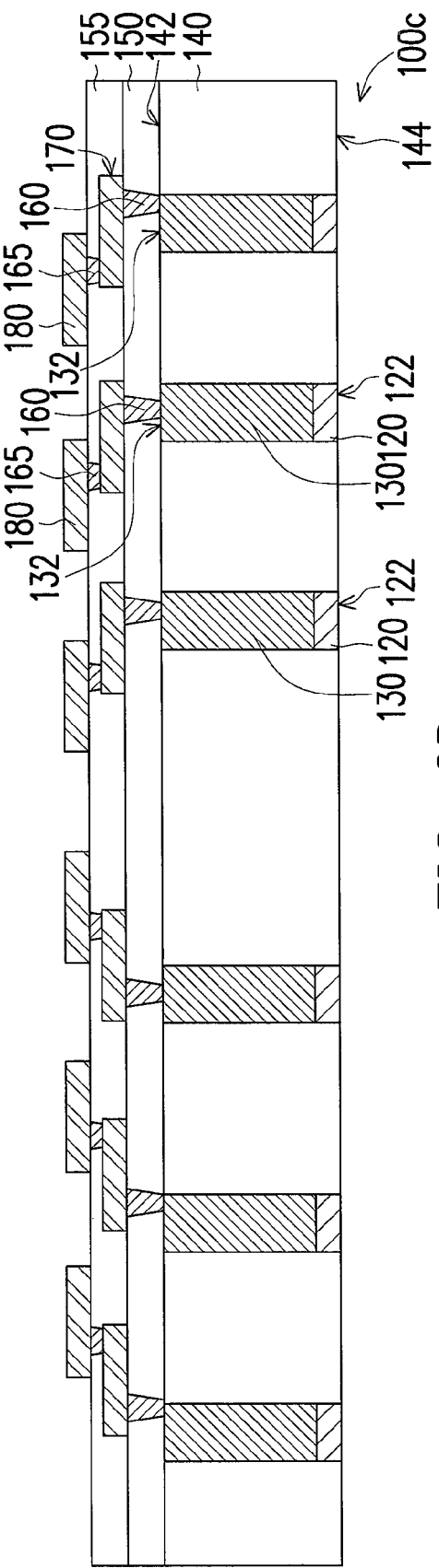

FIG. 2A to FIG. 2D are schematic cross-sectional views illustrating partial steps of a manufacturing method of an interposed substrate according to an embodiment. Referring to FIG. 2D, an interposed substrate 100c of the present embodiment is similar to the interposed substrate 100a or the previous embodiment, and a main difference is that the interposed substrate 100c of the present embodiment further includes a first dielectric layer 150, a plurality of first conductive through vias 160, a redistribution circuit layer 170, a second dielectric layer 155, a plurality of second conductive through vias 165, and a plurality of under ball metallurgy pads 180. In detail, the first dielectric layer 150 is disposed on an upper surface 142 of an insulating material layer 140, wherein the first dielectric layer 150 covers the upper surface 142 of the insulating material layer 140 and a top surface 132 of a plurality of conductive pillars 130. The first conductive through vias 160 penetrate through the first dielectric layer 150 and respectively connect the top surface 132 of the conductive pillars 130. The redistribution circuit layer 170 is disposed on the first dielectric layer 150 and connected the first conductive through vias 160, wherein the redistribution circuit layer 170 electrically connects with the conductive pillars 130 through the first conductive through vias 160. The second dielectric layer 155 is disposed on the redistribution circuit layer 170, wherein the second dielectric layer 155 covers the redistribution circuit layer 170 and the first dielectric layer 150. The second conductive through vias 165 are embedded within the second dielectric layer 155 and connected the redistribution circuit layer 170. A plurality of under ball metallurgy pads 180 are disposed on the second dielectric layer 155 and respectively connected the second conductive through vias 165, wherein the under ball metallurgy pads 180 electrically connect the redistribution circuit layer 170 through the second conductive through vias 165.

In process of manufacturing, the interposed substrate 100c of the present embodiment may substantially adopt the same manufacturing method as the interposed substrate 100a of the previous embodiment, and after the steps illustrated in FIG. 1D, viz. after the insulating material layer 140 is formed on a metal carrier 110 and before the metal carrier 110 is removed, referring to FIG. 2A, form the first dielectric layer 150 on the insulating material layer 140, wherein the first dielectric layer 150 covers the upper surface 142 of the insulating material layer 140 and the top surfaces 132 of the conductive pillars 130. Next, the first conductive through vias 160 is formed, wherein the first conductive through vias 160 penetrate through the first dielectric layer 150 and respectively connect the tops surfaces 132 of the conductive pillars 130. Then, the redistribution circuit layer 170 is formed on the first dielectric layer 150, wherein the redistribution circuit layer 170 connects the first conductive through vias 160 and electrically connects with the conductive pillars 130 through the first conductive through vias 160.

Referring to FIG. 2B, the second dielectric layer 155 is formed on the redistribution circuit layer 170, wherein the second dielectric layer 155 covers the redistribution circuit layer 170 and the first dielectric layer 150. Next, the second conductive through vias 165 are formed, wherein the second conductive through vias 165 are embedded within the second dielectric layer 155 and connected the redistribution circuit layer 170. Then, the under ball metallurgy pads 180 are formed on the second dielectric layer 155, wherein the under ball metallurgy pads 180 respectively connect second the conductive through vias 155 and electrically connects with the redistribution circuit layer 170 through the second conductive through vias 155.

Figure 2E:
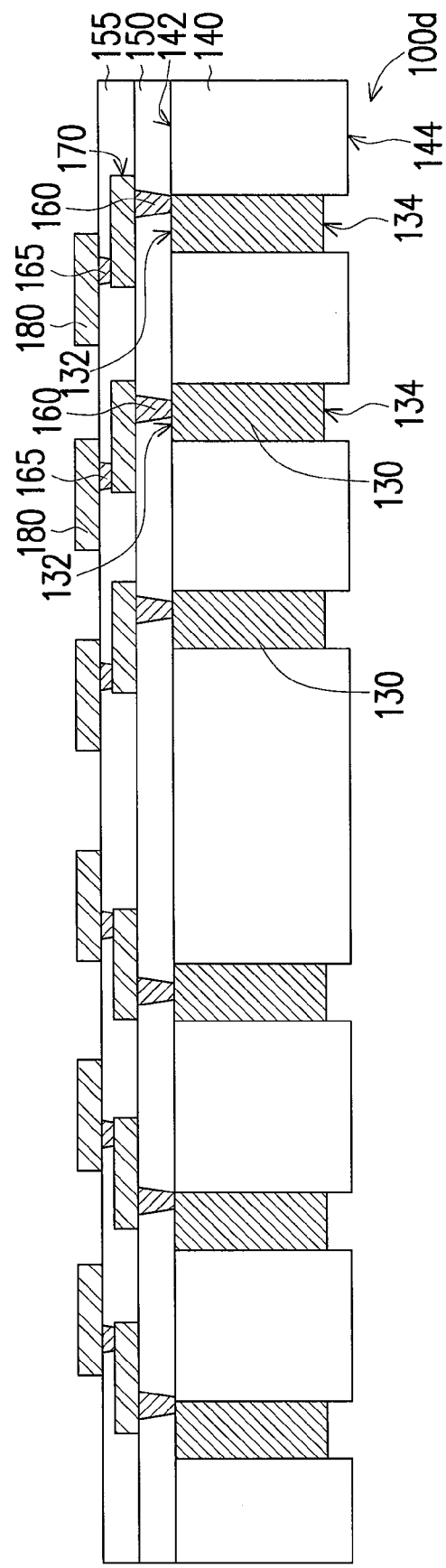
FIG. 2E is a schematic cross-sectional view illustrating an interposed substrate according to an embodiment.

Referring to FIG. 2C, an adhesive tape 10 is provided on the under ball metallurgy pads 180, wherein the adhesive tape 10 covers the under ball metallurgy pads 180 and the second dielectric layer 155. Next, referring to FIG. 2C and FIG. 2D, the adhesive tape 10 is removed after the metal carrier 110 is removed by a back etching process, so as to expose the lower surface 144 opposite to the upper surface 142 of the insulating material layer 140. Herein, a bottom surface 122 of a plurality of metal passivation pads 120 and a lower surface 144 of the insulating material layer 140 are substantially coplanar. At this point, the manufacture of the interposed substrate 100c is completed. Certainly, in order to have the favorable joining between the subsequent solder balls (not shown), the metal passivation pads 120 may also be removed after removing the metal carrier 110, referring to FIG. 2E, so as to expose the bottom surface 134 of the each conductive pillar 130 to complete the manufacture of the interposed substrate 100d. It is noted that a step of removing the metal passivation pads 120 is a selective step, and users according to a material of the chosen solder ball and the material of the metal passivation pads 120 may select whether to perform the step of removing the metal passivation layer 120, and it is limited herein.

FIG. 3A to FIG. 3E are schematic cross-sectional views illustrating a manufacturing method of an interposed substrate according to an embodiment. Referring to FIG. 3E, an interposed substrate 100e of the present embodiment is similar to the interposed substrate 100a of the previously embodiment, and a main difference is that the interposed substrate 100e of the present embodiment further includes a plurality of under ball metallurgy pads 190, wherein under ball metallurgy pads 190 are respectively disposed within a plurality of through holes 143 of an insulating material layer 140, and the under ball metallurgy pads 190 are respectively located between a plurality of metal passivation pads 120 and a plurality of conductive pillars 130.

In process of manufacturing, the interposed substrate 100e of the current embodiment may substantially adopt the same manufacturing method as the interposed substrate 100a of the previous embodiment, and after the steps illustrated in FIG. 1A, viz. after the metal passivation pads 120 is formed and before the conductive pillars 130 is formed in a plurality of openings 113 of a photoresist layer 112, referring to FIG. 3A, form the under ball metallurgy pads 190 in the openings 113 of the photoresist layer 112, wherein the under ball metallurgy pads 190 covers the metal passivation pads 120. The under ball metallurgy pads 190, herein, is constituted of a first metal layer 192 and a second metal layer 194, wherein the first metal layer 192 is located between the metal passivation pads 120 and the second metal layer 194, and a material of the first metal layer 192 and a material of the second metal layer 194 include copper, nickel or gold. Certainly, in other embodiments (not shown), the under ball metallurgy pads 190 may further be constituted of more than three layers of metal layers.

Referring to FIG. 3A and FIG. 3B, the conductive pillars 130 are formed in the openings 113 of the photoresist layer 112, wherein the conductive pillars 130 are respectively stacked on the under ball metallurgy pads 190, and the under ball metallurgy pads 190 are located between the metal passivation pads 120 and the conductive pillars 130. Next, the photoresist layer 112 is removed to expose another portion of a metal carrier 110. Herein, a step of forming the conductive pillars 130 is to electroplate the conductive pillars 130 at the openings 113 through utilizing the photoresist layer 112 as an electroplating mask, wherein a material of the conductive pillars 130 is, for example, copper, nickel or gold.

Referring to FIG. 3C, an insulating material layer 140a is formed on the metal carrier 110 through a printing process or a thermal pressing process, wherein the insulating material layer 140a covers another portion of the metal carrier 110 and encapsulates the conductive pillars 130, the under ball metallurgy pads 190 and the metal passivation pads 120. At this point, a top surface 132 of each conductive pillar 130 is completed covered by the insulating material layer 140a, and a material of the insulating material layer 140a is, for example, ajinomoto build-up film (ABF) resin, benzocyclobutene (BCB) resin, photoresist material (e.g., a material researched and developed by Shin-Etsu Chemical Co., Ltd; in brief: SINR), polybenzoxazole (PBO), methyl silicone resin, ethyl silicone resin, phenyl silicone resin, epoxy silicone resin, or polymer resin.

Referring to FIG. 3D, a part of the insulating material layer 140a is removed through a grinding process or a laser-lift off process, so as to form the insulating material layer 140 exposing the top surfaces 132 of the conductive pillars 130. At this point, an upper surface 142 of the insulating material layer 140 and the top surfaces 132 of the conductive pillars 130 are substantially coplanar.

Referring to FIG. 3E, the metal carrier 110 is removed to expose a lower surface 144 opposite to the upper surface 142 of the insulating material layer 140, wherein a removal of the metal carrier 110 is, for example, a back etching process. Herein, a bottom surface 122 of each metal passivation pad 120 and the lower surface 144 of the insulating material layer 140 are substantially coplanar. At this point, the manufacture of the interposed substrate 100e is completed.

Noteworthily, in order to have a favorable joining between a plurality of subsequent solder balls (not shown), the metal passivation pads 120 may also be removed after removing the metal carrier 110, referring to FIG. 3F, so as to expose a bottom surface 196 of the each under ball metallurgy pad 190 to complete the manufacture of the interposed substrate 100f. It is noted that the step of removing the metal passivation pads 120 is a selective step, and users according to a material of the chosen solder ball and the material of the metal passivation pads 120 may select whether to perform the step of removing the metal passivation layer 120, and it is limited herein.

Figure 4A:
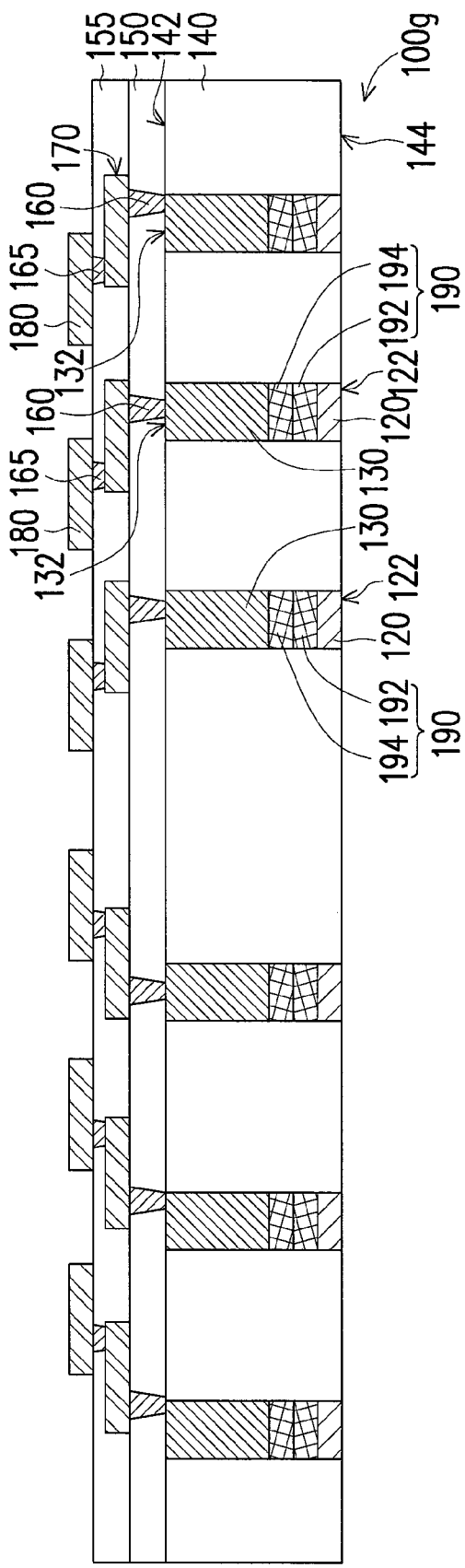
FIG. 4A is a schematic cross-sectional view illustrating an interposed substrate according to another embodiment.
Figure 4B:
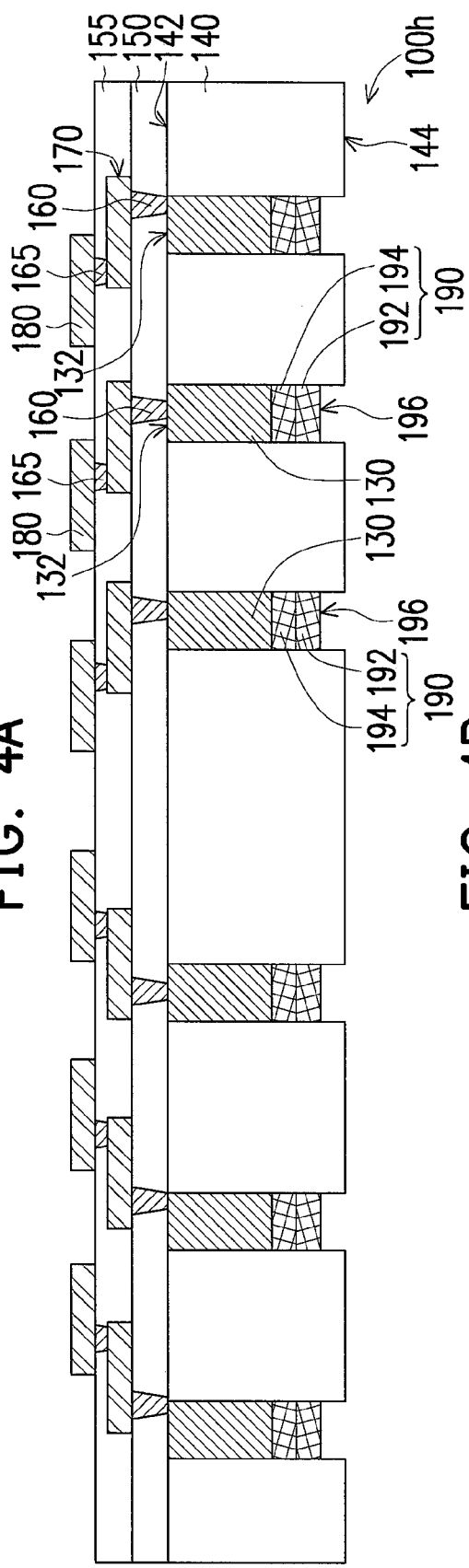
FIG. 4B is a schematic cross-sectional view illustrating an interposed substrate according to another embodiment.

In addition, in other embodiments, referring to FIG. 4A and FIG. 4B, after the step illustrated in FIG. 3D, viz. after an insulating material layer 140 is formed on a metal carrier 110 and before the metal carrier 110 is removed, one of ordinary skill in the art would be able to selectively choose the steps illustrated in FIG. 2A to 2D for completing an interposed substrate 100g including a plurality of metal passivation pads 120, a plurality of under ball metallurgy pads 190, a plurality of conductive pillars 130, a insulating material layer 140, a first dielectric layer 150, a first conductive through vias 160, a redistribution circuit layer 170, a second dielectric layer 155, a plurality of second conductive through vias 165, and a plurality of under ball metallurgy pads 180; or for completing an interposed substrate 100h including a plurality of under ball metallurgy pads 190, a plurality of conductive pillars 130, a insulating material layer 140, a first dielectric layer 150, a plurality of first conductive through vias 160, a redistribution circuit layer 170, a second dielectric layer 155, a plurality of second conductive through vias 165, and a plurality of under ball metallurgy pads 180. One of ordinary skill in the art, according to actual requirements, may refer to the descriptions of the previous embodiments to selectively choose the process steps and the components so as to achieve the desired technical effect.

In summary, the manufacture of the interposed substrate of the invention forms the conductive pillars through utilizing the metal carrier, subsequently forms the insulating material layer on the metal carrier to cover the conductive pillars, and then removes the metal carrier to expose the lower surface of the insulating material layer. Consequently, in comparison to the conventional technique of manufacturing the interposed substrate using the silicon wafer, the interposed substrate of the invention is capable of effectively reducing the manufacture cost and having relatively simple manufacture steps. Furthermore, since the conductive pillars are covered by the insulating material layer, such that no electrical leakage problem would occur even through without the additional fabrication of the insulating layer, the interposed substrate of the invention may have a favorable electrical reliability. In addition, the conductive pillars are covered by the insulating material layer, and prevented the subsequent process from being influenced by the etchant, thus enabling the interposed substrate of the invention to have the favorable structure reliability.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. An interposed substrate comprising:
   an insulating material layer having an upper surface and a lower surface opposite to each other and a plurality of through holes penetrating through the insulating material layer;
   a plurality of conductive pillars respectively disposed within the through holes of the insulating material layer, wherein each conductive pillar has a top surface and a bottom surface opposite to each other, and the top surface of each conductive pillar and the upper surface of the insulating material layer are coplanar;
   a plurality of metal passivation pads respectively disposed within the through holes of the insulating material layer, wherein the conductive pillars are respectively stacked on the metal passivation pads, and a bottom surface of each metal passivation pad and the lower surface of the insulating material layer are coplanar; and
   a plurality of under ball metallurgy pads respectively disposed within the through holes of the insulating material layer, wherein the under ball metallurgy pads are respectively located between the metal passivation pads and the conductive pillars.

2. The interposed substrate as recited in claim 1 further comprising:
   a first dielectric layer disposed on the upper surface of the insulating material layer, wherein the first dielectric layer covers the upper surface of the insulating material layer and the top surfaces of the conductive pillars;
   a plurality of first conductive through vias penetrating through the first dielectric layer and respectively connecting the tops surfaces of the conductive pillars; and a redistribution circuit layer disposed on the first dielectric layer and connecting the first conductive through vias, wherein the redistribution circuit layer electrically connects with the conductive pillars through the first conductive through vias.

3. The interposed substrate as recited in claim 2 further comprising:
- a second dielectric layer disposed on the redistribution circuit layer, wherein the second dielectric layer covers the redistribution circuit layer and the first dielectric layer;
- a plurality of second conductive through vias embedded within the second dielectric layer and connecting the redistribution circuit layer; and
- a plurality of under ball metallurgy pads disposed on the second dielectric layer and respectively connecting the second conductive through vias, wherein the under ball metallurgy pads electrically connects the redistribution circuit layer through the second conductive through vias.

* * * * *